(12) United States Patent
Pei et al.

(10) Patent No.: US 7,508,050 B1
(45) Date of Patent: Mar. 24, 2009

(54) NEGATIVE DIFFERENTIAL RESISTANCE DIODE AND SRAM UTILIZING SUCH DEVICE

(75) Inventors: Gen Pei, Sunnyvale, CA (US); Zoran Krivokapic, Santa Clara, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 370 days.

(21) Appl. No.: 11/378,221

(22) Filed: Mar. 16, 2006

(51) Int. Cl.
*H01L 29/72* (2006.01)
(52) U.S. Cl. .................. 257/616; 257/107; 257/321; 257/401; 365/175
(58) Field of Classification Search ............. 257/107, 257/321, 401, 616; 365/175

See application file for complete search history.

(56) References Cited

U.S. PATENT DOCUMENTS 3,967,305 A * 6/1976 Zuleeg ..................... 257/8
6,501,135 B1 * 12/2002 Krivokapic ............... 257/354

* cited by examiner

*Primary Examiner*—Edward Wojciechowicz
(74) *Attorney, Agent, or Firm*—Ingrassia Fisher & Lorenz, P.C.

(57) ABSTRACT

A negative differential resistance (NDR) diode and a memory cell incorporating that NDR diode are provided. The NDR diode comprises a p-type germanium region in contact with an n-type germanium region and forming a germanium pn junction diode. A first gate electrode overlies the p-type germanium region, is electrically coupled to the n-type germanium region, and is configured for coupling to a first electrical potential. A second gate electrode overlies the n-type germanium region and is configured for coupling to a second electrical potential. A third electrode is electrically coupled to the p-type germanium region and may be coupled to the second gate electrode. A small SRAM cell uses two such NDR diodes with a single pass transistor.

14 Claims, 4 Drawing Sheets

NEGATIVE DIFFERENTIAL RESISTANCE DIODE AND SRAM UTILIZING SUCH DEVICE

TECHNICAL FIELD

The present invention generally relates to negative differential resistance (NDR) diodes, and more particularly relates to germanium based NDR diodes and to their application to memory cells.

BACKGROUND

In the semiconductor industry there is a continuous effort to increase the amount of information that can be stored by an individual memory chip, to decrease the power consumption by the chip and to improve the reliability of the stored information. The effort to increase the memory storage necessarily dictates a corresponding effort to reduce the size of the memory cell. Reducing the size of the memory cell and the power consumption are not always consistent with the goal of improving reliability of the stored information.

The standard static random access memory (SRAM) cell is a six transistor cell. The only way to reduce the size of this cell is to shrink or reduce the design rules; that is, to reduce the minimum allowable size of elements or spacing between elements. Reducing the design rules increases manufacturing difficulty and reduces reliability. One alternative proposal for reducing memory size has been to replace the six transistor cell with a cell comprising one transistor and two negative differential resistance (NDR) diodes. Unfortunately, to date the available NDR diodes provide a peak to valley current ratio of only ten or less which is insufficient for large scale SRAM applications. In addition, the available NDR diodes have required thin alternating layers of compound semiconductor materials deposited by molecular beam epitaxy. Such diodes cannot be easily and inexpensively integrated into large scale memories.

Accordingly, it is desirable to provide an NDR diode that can be easily manufactured and integrated into a large scale integrated circuit. In addition, it is desirable to provide a memory cell that includes NDR diodes that can be readily manufactured, has a small "footprint", reduces power consumption, and is stable and reliable. Furthermore, other desirable features and characteristics of the present invention will become apparent from the subsequent detailed description and the appended claims, taken in conjunction with the accompanying drawings and the foregoing technical field and background.

BRIEF SUMMARY

A negative differential resistance (NDR) diode is provided. In accordance with one embodiment of the invention the NDR diode comprises a p-type germanium region in contact with an n-type germanium region and forming a germanium pn junction diode. A first gate electrode overlies the p-type germanium region, is electrically coupled to the n-type germanium region, and is configured for coupling to a first electrical potential. A second gate electrode overlies the n-type germanium region and is configured for coupling to a second electrical potential. A third electrode is electrically coupled to the p-type germanium region and may be coupled to the second gate electrode.

A compact memory cell is also provided that utilizes NDR diodes. In accordance with one embodiment of the invention the memory cell comprises a layer of monocrystalline semiconductor material such as germanium overlying an insulator layer. A first negative differential resistance diode and a second negative differential resistance diode are formed in the layer of monocrystalline semiconductor material and are electrically coupled at a first node. An MOS transistor having a source region coupled to the first node, a gate electrode coupled to a word line, and a drain region coupled to bit line is formed in the layer of monocrystalline semiconductor material.

BRIEF DESCRIPTION OF THE DRAWINGS

The present invention will hereinafter be described in conjunction with the following drawing figures, wherein like numerals denote like elements, and wherein FIG. 1 schematically illustrates, in cross section, a negative differential resistance (NDR) diode in accordance with one embodiment of the invention.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. Various steps in the manufacture of MOS transistors and NDR diodes are well known and so, in the interest of brevity, many conventional steps will only be mentioned briefly herein or will be omitted entirely without providing the well known process details.

Figure 1:
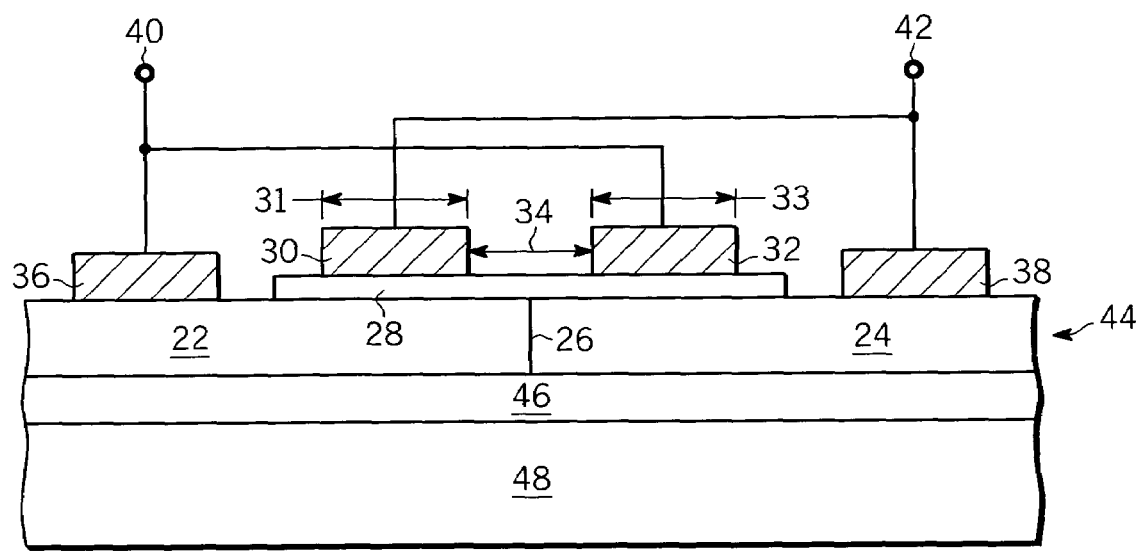

FIG. 1 illustrates schematically, in cross section, elements of a negative differential resistance (NDR) diode 20 in accordance with one embodiment of the invention. NDR diode 20 includes an n-type semiconductor region 22 in contact with a p-type semiconductor region 24 with the two regions forming a pn junction 26 therebetween. A gate insulator 28 overlies a portion of n-type region 22 and a portion of p-type region 24. A first gate electrode 30 is formed on the gate insulator and overlies a portion of n-type region 22 at a location near pn junction 26. Gate electrode 30 has a width indicated by double headed arrow 31. A second gate electrode 32 is formed on the gate insulator and overlies a portion of p-type region 24 near pn junction 26. Gate electrode 32 has a width indicated by double headed arrow 33. The spacing between gate electrode 30 and gate electrode 32 is indicated by the double headed arrow 34. A first electrode 36 is formed in Ohmic contact with n-type region 22 and a second electrode 38 is formed in Ohmic contact with p-type region 24. A first terminal 40 of the NDR diode is coupled to first electrode 36 which, in turn is coupled to gate electrode 32. A second terminal 42 of the NDR diode is coupled to second electrode 38 which, in turn, is coupled to gate electrode 30.

In accordance with a preferred embodiment of the invention n-type region 22 and p-type region 24 are formed of monocrystalline germanium, and most preferably from a thin layer 44 of monocrystalline germanium overlying an insulator 46 (germanium on insulator or GeOI). As used herein, the terms "semiconductor substrate" or more specifically "germanium substrate" or "monocrystalline germanium substrate" will be used to encompass the relatively pure or lightly impurity doped substantially monocrystalline germanium materials typically used in the semiconductor industry. There are several techniques for forming thin layers of germanium on insulator such as the wafer bonding technique as described, for example, in the paper "Low defects and high quality $Al_2O_3$ Ge-on-insulator MOSFETs" by Yu, Huang, Chin, and Chen, Device Research Conference, 2003, 23-25 Jun. 2003, pages 39-40. The germanium layer can have a thickness less than about 15 nanometers (nm), and preferably a thickness of about 12 nm. The n-type region 22 and p-type region 24 can be impurity doped by ion implantation to a concentration of between about $1\times10^{18}$ and about $1\times10^{19}$ $cm^{-3}$, and preferably to a concentration of about $7\times10^{18}$ $cm^{-3}$ to form a pn junction 26. A substrate 48 or "handle" of silicon or other semiconductor material or dielectric material can be used to support insulator layer 46.

Gate insulator 28 can be formed any of a large number of dielectric materials commonly used in the semiconductor industry. For example, gate insulator 28 can be formed from silicon dioxide deposited by chemical vapor deposition (CVD) or low pressure chemical vapor deposition (LPCVD) from a tetraethylorthosilicate (TEOS) or silane ($SiH_4$) source. The gate insulator preferably has a thickness of about 0.9-1.1 nm. The gate electrodes can be formed of any metal, metal silicide, doped polycrystalline semiconductor material, or other conductive material, but preferably are formed of polycrystalline silicon that is appropriately modified to adjust the work function of the electrode to a predetermined value. Preferably gate electrode 30 is doped with antimony and then is silicided to adjust the work function to about 4.4 eV. Gate electrode 32 preferably is doped with arsenic, antimony or phosphorus, but is capped with a layer of silicon nitride or other barrier material to prevent the formation of silicide. Gate electrode 32 is thus doped with n-type conductivity determining impurities but is not silicided to adjust the work function of that gate electrode to about 4.1 eV. The gate electrode can be formed by the CVD of a layer of polycrystalline silicon onto the gate insulator and by the subsequent deposition of a barrier layer. The polycrystalline silicon and barrier layer are photolithographically patterned and etched to define the gate electrodes. The barrier layer is removed from gate electrode 30 and a layer of nickel is deposited, for example by physical vapor deposition (PVD). The silicide can then be formed by heating the silicon/nickel structure to cause the silicon and nickel to react. The barrier layer prevents silicide from forming on gate electrode 32. The gate electrodes can be appropriately impurity doped by ion implantation. Gate electrodes 30 and 32 can have a length of between about 10 and 40 nm and a spacing 34 of between about 10 and 20 nm. Preferably the gate electrodes have a length of 20 nm or less and a spacing of 12 nm or less.

Figure 2:
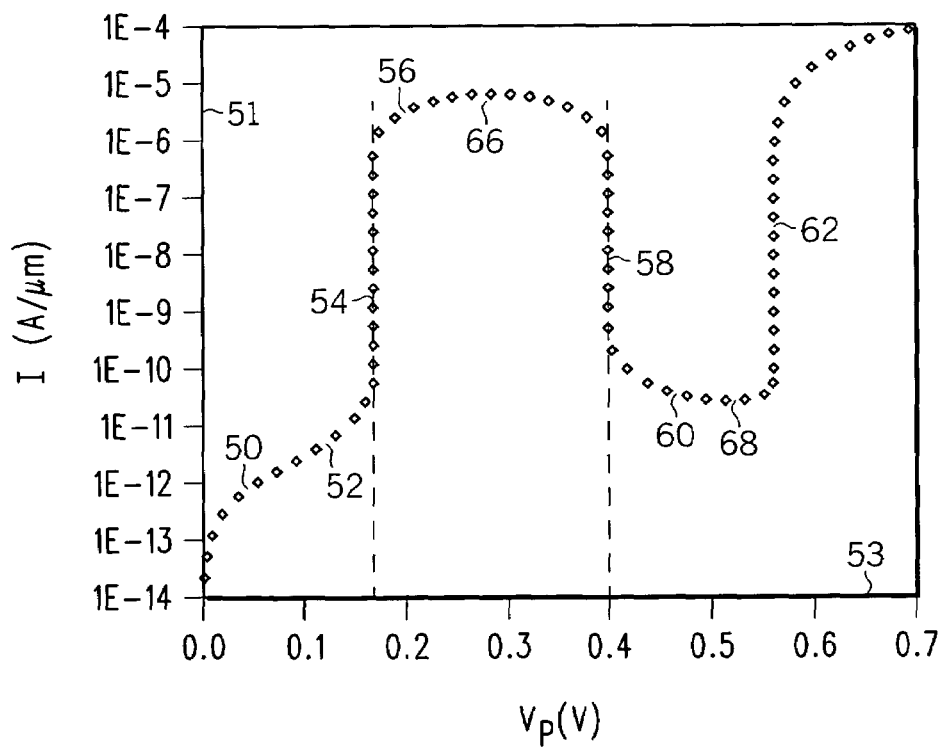
FIG. 2 illustrates the I-V characteristics of the NDR diode of FIG. 1.

FIG. 2 illustrates graphically the current-voltage (I-V) characteristics 50 of a negative differential resistance diode such as NDR diode 20 as a potential $V_p$ is applied across terminals 40 and 42. Terminal 40, for example, can be coupled to a potential $V_p$ while terminal 42 is coupled to a ground potential. Vertical axis 51 is in units of Amps/μm on a logarithmic scale (where the length dimension (μm) is a normalizing factor for the width of the gate electrode in the direction perpendicular to the plane of FIG. 1) and horizontal axis 53 is in units of volts. The characteristics in FIG. 2 correspond to a germanium NDR diode having the preferred impurity doping and gate electrode work functions described above, a gate insulator thickness of 0.9 nm, a gate length of 20 nm, a gate spacing of 20 nm, and a germanium layer thickness of 10 nm. As the potential $V_p$ is increased in the positive direction, pn junction 26 is reverse biased and the reverse leakage current of the junction increases slowly as indicated at 52. As $V_p$ is increased to about 0.17 volts the current through the diode increases rapidly as indicated at 54. The potential at which the current increases rapidly, $V_{on}$, corresponds to the impact ionization of pn junction 26. The bias applied to the junction across terminals 40 and 42 dominates the onset of the rapid current rise. As the applied potential is reverse biasing pn junction 26, the same bias, applied to gate electrodes 30 and 32, causes the depletion of carriers from the surface of the semiconductor material beneath gate insulator 28. The depletion of carriers causes a flattening of the I-V curve for applied biases of between about 0.17 volts and about 0.4 volts as indicated at 56. As the applied potential is increased beyond about 0.4 volts, the diode current decreases rapidly as indicated at 58. The bias at which the current decreases rapidly, $V_{off}$, corresponds to the full depletion of the semiconductor material under the gate insulator. The bias applied to the gate electrodes dominates the onset of the rapid decrease in diode current. Upon further increase in applied potential the current increases gradually as indicated at 60. The I-V behavior in this applied bias range is similar to the normal reverse bias leakage characteristics of a normal reverse biased diode. At an applied potential of about 0.58 volts the current again increases rapidly as indicated at 62. The peak current 66 is almost 5 orders of magnitude greater than the valley current 68. The peak to valley current ratio of more than five orders of magnitude is in contrast to the ratio of about 10 for prior art NDR diodes. Germanium is the preferred material for n-type region 22 and p-type region 24 because germanium has a narrow band gap of about 0.67 eV which contributes to high impact ionization and a low turn-on voltage for the germanium NDR diode.

Figure 3:
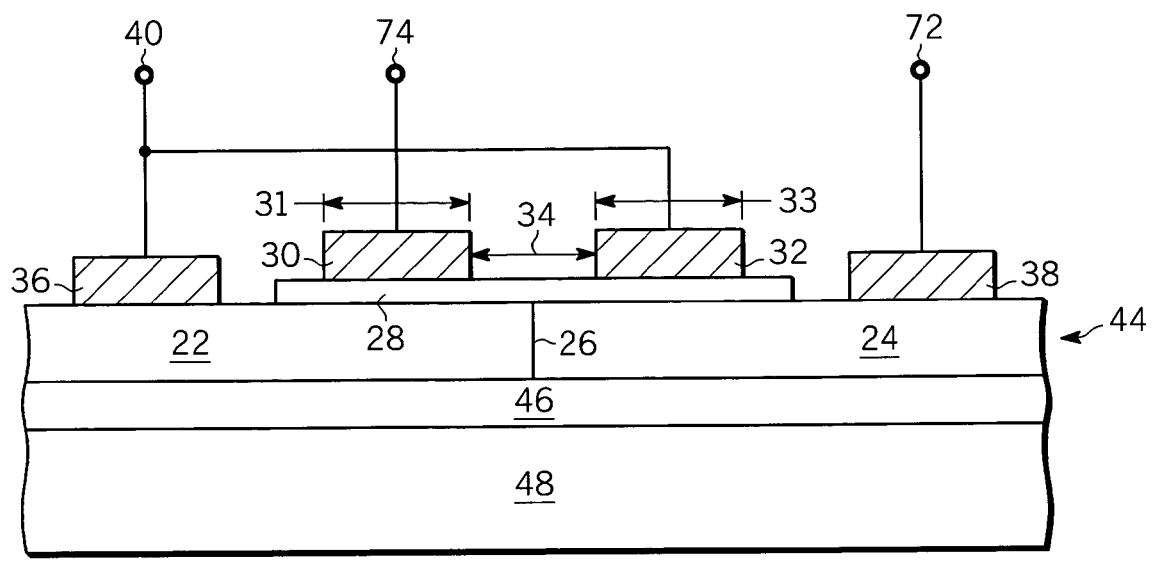
FIG. 3 schematically illustrates, in cross section, an NDR diode in accordance with a further embodiment of the invention.

FIG. 3 illustrates schematically, in cross section, a negative differential resistance diode 70 in accordance with a further embodiment of the invention. In accordance with this embodiment, NDR diode 70 is constructed identically to NDR diode 20 illustrated in FIG. 1 except that Ohmic contact 38 is coupled to a terminal 72, and gate electrode 30 is coupled to a terminal 74 instead of being coupled to Ohmic contact 38.

Figure 4:
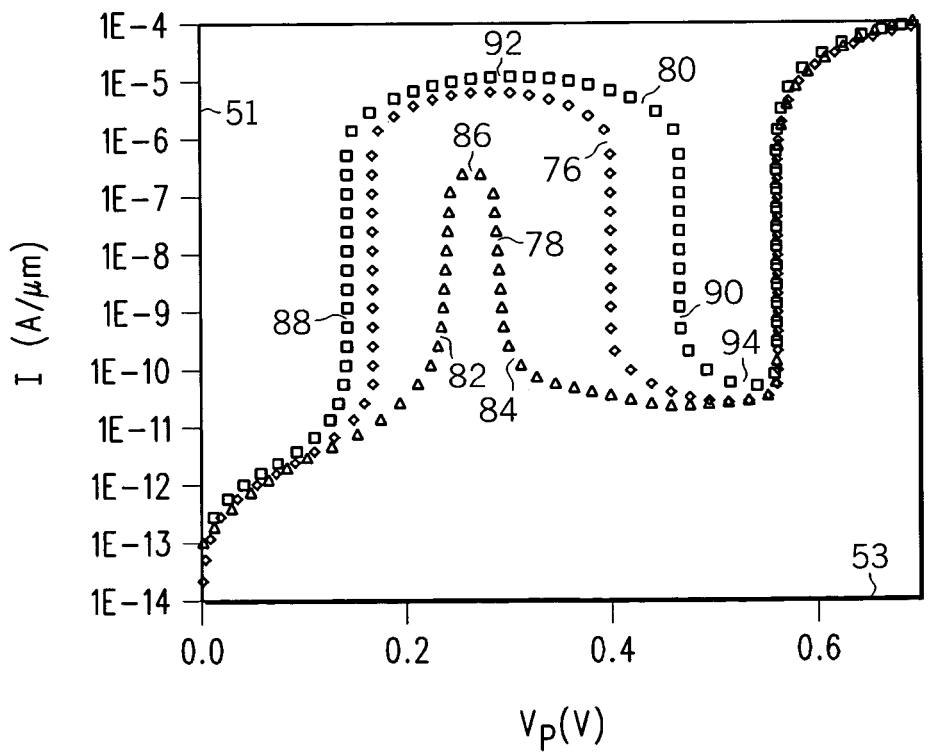
FIG. 4 illustrates the I-V characteristics of the NDR diode of FIG. 2.

FIG. 4 illustrates graphically the current-voltage (I-V) characteristics of a negative differential resistance diode such as NDR diode 70 as a potential $V_p$ is applied across terminals 40 and 72 with the potential applied to terminal 74 as a variable. Terminal 40, for example, can be coupled to a potential $V_p$ while terminal 72 is coupled to a ground potential. As with FIG. 2, vertical axis 51 is in units of Amps/μm on a logarithmic scale and horizontal axis 53 is in units of volts. Curve 76 corresponds to the diode currant with a bias of 0 volts applied to terminal 74, so this curve is identical to curve 50 in FIG. 2. Curve 78 corresponds to the diode current with a bias of +50 mV applied to terminal 74, and curve 80 corresponds to the diode current with a bias of −50 mV applied to terminal 74. The application of a positive bias to terminal 74 causes $V_{on}$ indicated at 82 to be shifted to a higher $V_p$, $V_{off}$ indicated at 84 to be shifted to a lower $V_p$, and decreases the peak current indicated at 86. The application of a negative bias to terminal 74 causes $V_{on}$ indicated at 88 to be shifted to a lower $V_p$, $V_{off}$ indicated at 90 to be shifted to a higher $V_p$, and increases the peak current indicated at 92 although the ratio of peak current to valley current (indicated at 94) remains approximately the same as when terminal 74 is zero biased.

Figure 5:
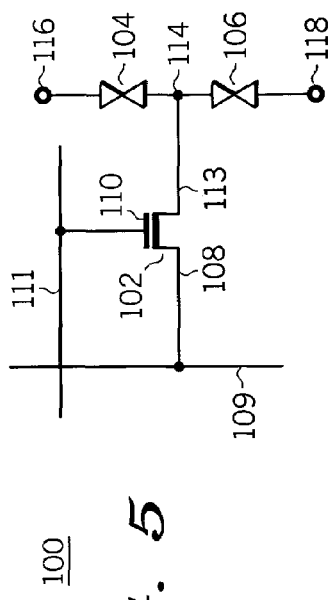
FIGS. 5-7. illustrate, schematically, in cross section, and in plan view, respectively, a SRAM cell in accordance with a further embodiment of the invention.
Figure 6:
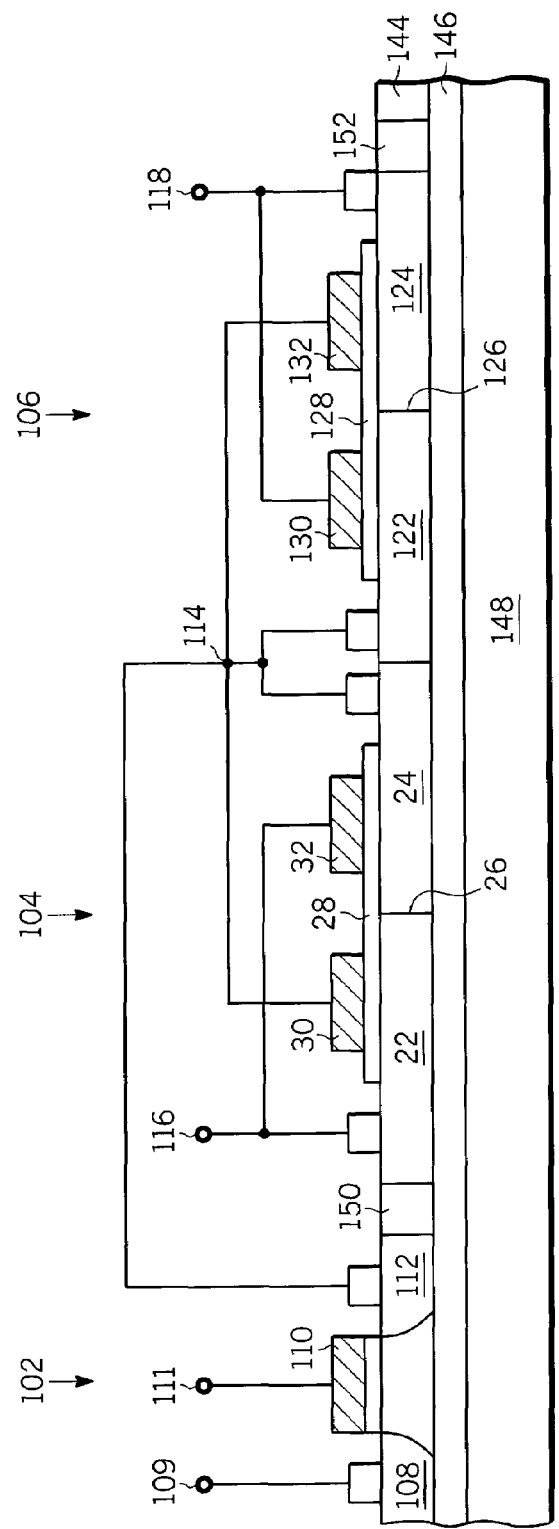
Figure 7:
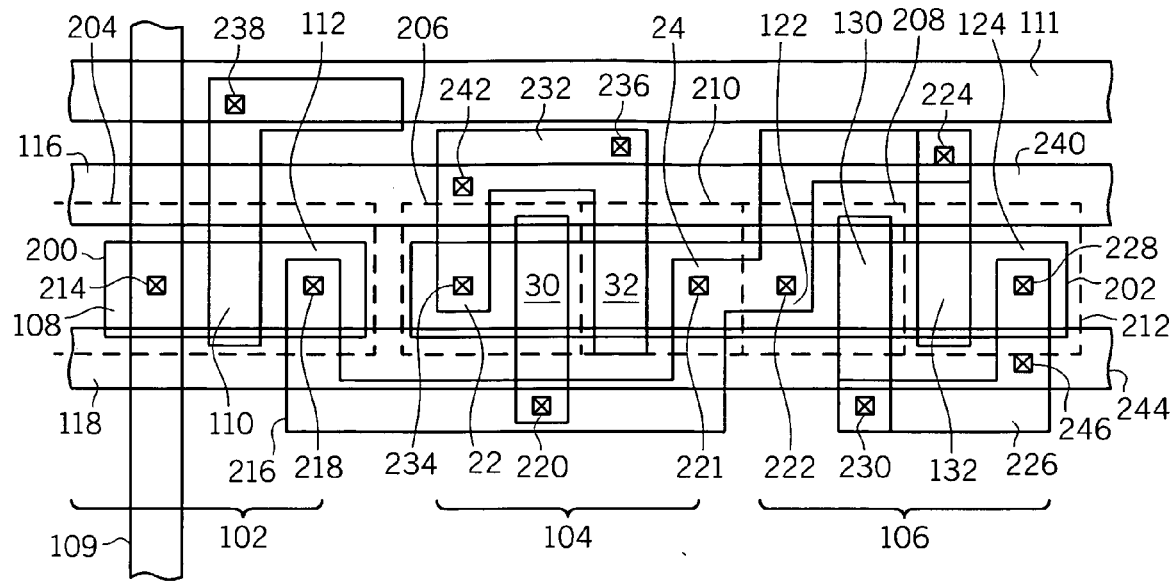

FIG. 5 illustrates schematically a static random access memory (SRAM) cell 100 in accordance with a further embodiment of the invention, FIG. 6 illustrates, in cross section, a possible construction of SRAM cell 100, and FIG. 7 illustrates, in plan view, a possible lay out of SRAM cell 100.

As illustrated in FIGS. 5 and 6, SRAM cell 100 includes an MOS transistor 102 and two NDR diodes 104 and 106. MOS transistor 102 is preferably an n-channel MOS transistor having a drain 108 coupled to a bit line 109, a gate electrode 110 coupled to a word line 111, and a source 112 coupled to a storage node 114. NDR diodes 104 and 106 are similar to NDR diode 20 illustrated in FIG. 1. The elements of NDR diode 104 are numbered in the same manner as NDR diode 20; the elements of NDR diode 106 are similarly numbered, but are given "100 numbers." NDR diode 104 includes an n-type region 22 and a p-type region 24, the two regions forming a pn junction diode 26. A gate insulator 28 overlies a portion of the n-type and p-type regions. Gate electrodes 30 and 32 are formed on the gate insulator overlying the n-type and p-type regions, respectively. NDR diode 106 includes an n-type region 122 and a p-type region 124, the two regions forming a pn junction diode 126. A gate insulator 128 overlies a portion of the n-type and p-type regions. Gate electrodes 130 and 132 are formed on the gate insulator overlying the n-type and p-type regions, respectively.

Preferably MOS transistor 102, NDR diode 104 and NDR diode 106 are all formed in a thin layer of germanium 144 on an insulator layer 146 that, in turn, is supported on a support substrate 148. Although the term "MOS transistor" properly refers to a device having a metal gate electrode and an oxide gate insulator, that term will be used herein to refer to any semiconductor transistor that includes a conductive gate electrode (whether metal or other conductive material) that is positioned over a gate insulator (whether oxide or other insulator) which, in turn, is positioned over a semiconductor substrate. Electrical isolation between device regions is formed, for example, by shallow trench isolation (STI) 150 and 152. As is well known, there are many processes that can be used to form the STI, so the process need not be described here in detail. In general, STI includes a shallow trench that is etched into the surface of the semiconductor substrate and that is subsequently filled with an insulating material. After the trench is filled with the insulating material the surface is usually planarized, for example by chemical mechanical planarization (CMP). Preferably the STI extends through the entire thickness of germanium layer 144. Gate insulator 28 and 128 as well as the gate insulator of MOS transistor 102 can be formed of silicon oxide or other dielectric material deposited, for example, by CVD or LPCVD. The gate electrode of MOS transistor 102 as well as gate electrodes 30, 32, 130, and 132 can be formed, for example, from nickel silicide or other conductive material that is appropriately impurity doped to adjust the work function of the electrode with respect to the underlying semiconductor material. Although it is convenient to deposit the gate insulator of the MOS transistor 102 at the same time as the gate insulator of the diodes, and to form the gate electrode of the MOS transistor at the same time and from the same material as gate electrodes 30, 32, 130, and 132, it may be advantageous in some devices to form a different gate structure for the two different types of devices. Drain region 108, source region 112, n-type regions 22 and 122, and p-type regions 24 and 124 can be formed by ion implantation of appropriate conductivity determining impurities.

N-type region 22 is electrically coupled to gate electrode 32 and to $V_{ref1}$ 116, a first reference voltage source. P-type region 24 is electrically coupled to gate electrode 30, to n-region 122, to gate electrode 132, and to storage node 114. P-type region 124 is coupled to gate electrode 130 and to $V_{ref2}$ 118, a second reference voltage source. $V_{ref1}$ is a positive potential and $V_{ref2}$ is preferably ground potential.

FIG. 7 illustrates, in plan view, a possible layout for SRAM cell 100. Lines 200 and 202 define active areas, those areas in which active semiconductor devices are formed. Line 200 defines the active area in which MOS transistor 102 is formed, and line 202 defines the active area in which NDR diodes 104 and 106 are formed. The area immediately outside the active areas is STI, electrically isolating the devices within the active areas. After depositing a gate insulator and forming gate electrodes 110, 30, 32, 130, and 132, the drain 108 and source 112 regions of MOS transistor 102 can be formed by an n+ ion implantation, the extent of which is defined by a photoresist mask having an outline indicated by dotted line 204 and by gate electrode 110. N-type regions 22 and 122 can be formed by an n-type ion implantation, the extent of which is defined by photoresist masks having outlines indicated by dotted lines 206 and 208, respectively, and by gate electrodes 30 and 130. P-type regions 24 and 124 can be formed by a p-type ion implantation, the extent of which is defined by photoresist masks having outlines indicated by dotted lines 210 and 212, respectively, and by gate electrodes 32 and 132. Bit line 109 is formed by a first conductive layer, preferably a metal layer, that contacts drain region 108 of MOS transistor 102 at a contact indicated by square 214. The first conductive layer also forms a line 216 that contacts source region 112 of MOS transistor 102 at a contact indicated by square 218, gate electrode 30 at a contact indicated by square 220, p-type region 24 at a contact indicated by square 221, n-type region 122 at a contact indicated by square 222 and gate electrode 132 at a contact indicated by square 224. The first conductive layer also forms a line 226 that contacts p-type region 124 at a contact indicated by square 228 and gate electrode 130 at a contact indicated by square 230. The first conductive layer also forms a line 232 that contacts n-type region 22 at a contact indicated by square 234 and gate electrode 32 at a contact indicated by square 236. Word line 111 is formed by a second conductive layer, preferably also a metal layer, that contacts gate electrode 110 of MOS transistor 102 at a contact indicated by square 238. The second conductive layer also forms a line 240 coupling $V_{ref1}$ to first conductive layer line 232 at a contact indicated by square 242. The second conductive layer also forms a line 244 coupling $V_{ref2}$ to first conductive layer line 226 at a contact indicated by square 246. As those of skill in the art will understand, dielectric layers can be deposited and patterned to allow desired contact and to prevent undesired contact between the conductive layers and between the conductive layers and underlying device regions. The small footprint of the SRAM cell allows the fabrication of large, high density memories.

Figure 8:
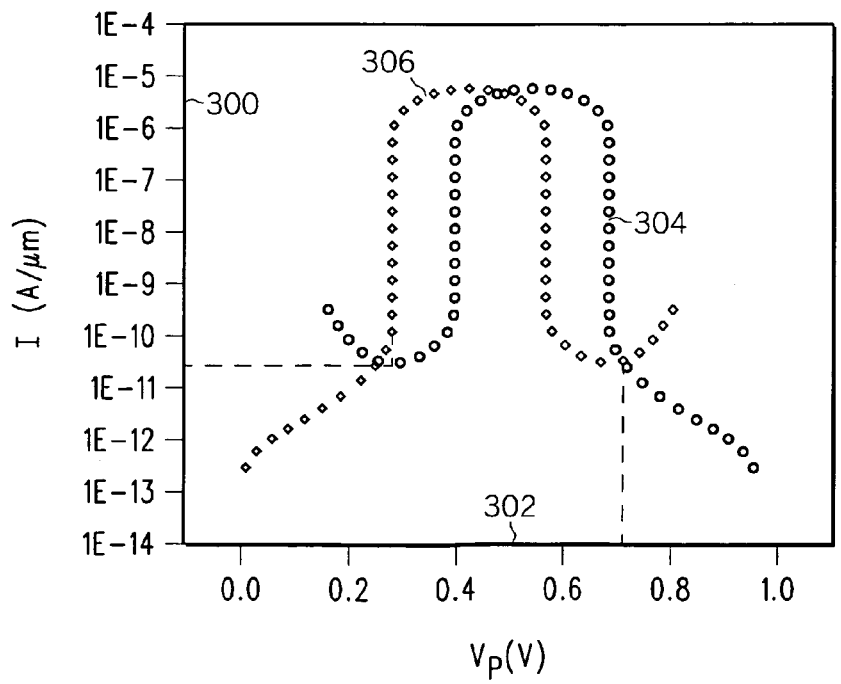
FIG. 8 illustrates the I-V characteristics of the NDR diodes in the SRAM cell of FIG. 5.

FIG. 8 illustrates graphically the I-V characteristics of NDR diode 104 and NDR diode 105 as those two devices are coupled in the SRAM cell of FIG. 5. The illustrated characteristics correspond to NDR diodes for which $V_{ref1}$=0.97 v, $V_{ref2}$=ground, the gate insulator thickness is 1.0 nm, germanium layer 144 has a thickness of 12 nm, the gate to gate spacing is 12 nm, and the doping in both the n-type regions and the p-type regions is $7 \times 10^{18}$ cm$^{-3}$. Vertical axis 300 is in units of Amps/µm and horizontal axis 302 is in units of volts. Curve 304 represents the current through NDR diode 104 and curve 306 represents the current through diode 106. The current minimum for curve 306 occurs at a voltage of about 0.71 v; this corresponds to the storage of a "1" at node 114. The current minimum for curve 304 occurs at a voltage of about 0.25 v; this corresponds to the storage of a "0" at node 114. The ratio of peak current at nearly $10^{-5}$ Amps/µm to the valley current of less than $10^{-10}$ Amps/µm provides for SRAM stability and data reliability. The low valley current provides for low power consumption of the SRAM cell. The low turn on voltage of less than 0.3 v allows the use of low voltage power supplies and makes the cell CMOS compatible.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof. For example, although MOS transistor 102 has been described and illustrated as being a germanium transistor formed in thin germanium layer 146, the transistor and some or all of the transistors that form the peripheral circuitry of a memory circuit can also be fabricated as conventional silicon transistors. For example, the NDR diodes could be fabricated in a localized germanium layer formed overlying a silicon substrate and the MOS transistors could be fabricated in the silicon substrate.

What is claimed is:

1. A negative differential resistance diode comprising:
    a first n-type semiconductor region;
    a second p-type semiconductor region in contact with the first n-type semiconductor region and forming a pn junction with the first n-type semiconductor region;
    a gate insulator overlying a portion of the first n-type semiconductor region and a portion of the second p-type semiconductor region;
    a first gate electrode on the gate insulator overlying the portion of the first n-type semiconductor region;
    a second gate electrode on the gate insulator overlying the portion of the first p-type semiconductor region;
    a first electrode contacting the second p-type semiconductor region and coupled to the first gate electrode; and
    a second electrode contacting the first n-type semiconductor region and coupled to the second gate electrode.

2. The negative differential resistance diode of claim 1 wherein the first n-type semiconductor region comprises an n-type germanium region and the second p-type semiconductor region comprises a p-type germanium region.

3. The negative differential resistance diode of claim 1 wherein the first n-type semiconductor region and the second p-type semiconductor region comprises regions in a layer of monocrystalline germanium on insulator.

4. The negative differential resistance diode of claim 1 wherein the first gate electrode comprises a metal silicide doped with a first conductivity determining impurity selected to adjust the work function of the first gate electrode to a first predetermined value and wherein the second gate electrode comprises polycrystalline silicon doped with a second conductivity determining impurity selected to adjust the work function of the second gate electrode to a second predetermined value.

5. The negative differential resistance diode of claim 1 wherein the first gate electrode is spaced apart from the second gate electrode by a distance of between about 10 and 20 nm.

6. A negative differential resistance diode comprising:
    a p-type germanium region in contact with an n-type germanium region and forming a germanium pn junction diode;
    a first gate electrode overlying the p-type germanium region, electrically coupled to the n-type germanium region, and configured for coupling to a first electrical potential;
    a second gate electrode overlying the n-type germanium region and configured for coupling to a second electrical potential; and
    a third electrode electrically coupled to the p-type germanium region, and configured for coupling to a third electrical potential; wherein
    the first electrical potential, the second electrical potential and the third electrical potential bias the germanium pn junction diode and influence depletion of the p-type germanium region and depletion of the n-type germanium region.

7. The negative differential resistance diode of claim 6 wherein the p-type germanium region and the n-type germanium region comprises regions formed in a layer of germanium on an insulator.

8. The negative differential resistance diode of claim 7 wherein the p-type germanium region and the n-type germanium region are each doped to a concentration between about $1\times10^{18}$ and about $1\times10^{19}$ cm$^{-3}$.

9. The negative differential resistance diode of claim 6 wherein the first gate electrode and the second gate electrode overlie a gate insulator having a thickness between about 0.9 and 1.1 nm.

10. The negative differential resistance diode of claim 6 wherein the first gate electrode and the second gate electrode are separated by a spacing less than 20 nm.

11. The negative differential resistance diode of claim 6 wherein the third electrode is coupled to the second electrode, and wherein the third electrical potential is the same as the second electrical potential.

12. The negative differential resistance diode of claim 6 wherein the pn junction diode is reverse biased by the first electrical potential and the second electrical potential.

13. The negative differential resistance diode of claim 6 wherein the first gate electrode and the second gate electrode each have a width between about 10 and 40 nm.

14. A negative differential resistance diode comprising:
    an n-type semiconductor region;
    a p-type semiconductor region in contact with the n-type semiconductor region and forming a pn junction with the n-type semiconductor region;
    a gate insulator overlying a portion of the n-type semiconductor region and a portion of the p-type semiconductor region;
    a first gate electrode on the gate insulator overlying the portion of the n-type semiconductor region, the first gate electrode being configured for biasing with a first electrical potential;
    a second gate electrode on the gate insulator overlying the portion of the p-type semiconductor region, the second gate electrode being configured for biasing with a second electrical potential;
    a first electrode contacting the p-type semiconductor region and coupled to the first gate electrode; and
    a second electrode contacting the n-type semiconductor region and coupled to the second gate electrode; wherein
    the first electrical potential and the second electrical potential bias the pn junction and influence depletion of the n-type semiconductor region and the p-type semiconductor region.

* * * * *